US012648363B2

(12) United States Patent
Lee et al.

(10) Patent No.: US 12,648,363 B2
(45) Date of Patent: Jun. 2, 2026

(54) MAGNETIC TUNNEL JUNCTION DEVICE AND STOCHASTIC COMPUTING SYSTEM INCLUDING THE SAME

(71) Applicant: Samsung Electronics Co., Ltd., Suwon-si (KR)

(72) Inventors: Sung Chul Lee, Osan-si (KR); Kwang Seok Kim, Seoul (KR); Jeong-Heon Park, Hwaseong-si (KR)

(73) Assignee: Samsung Electronics Co., Ltd., Uwon-si (KR)

( * ) Notice: Subject to any disclaimer, the term of this patent is extended or adjusted under 35 U.S.C. 154(b) by 1067 days.

(21) Appl. No.: 17/734,455

(22) Filed: May 2, 2022

(65) Prior Publication Data

US 2023/0111057 A1 Apr. 13, 2023

(30) Foreign Application Priority Data

Oct. 8, 2021 (KR) ........................ 10-2021-0134185

(51) Int. Cl.
*G11C 11/00* (2006.01)
*H10N 50/80* (2023.01)
*H10N 50/85* (2023.01)

(52) U.S. Cl.
CPC ............. *H10N 50/80* (2023.02); *H10N 50/85* (2023.02)

(58) Field of Classification Search
CPC ............................... H10N 50/80; H10N 50/85
USPC ........................................................ 365/158
See application file for complete search history.

(56) References Cited

U.S. PATENT DOCUMENTS

| | | | | |
|---|---|---|---|---|
| 6,649,960 | B1 * | 11/2003 | Cross ..................... | H10N 50/10 |
| | | | | 257/E27.005 |
| 6,667,897 | B1 * | 12/2003 | Abraham ............... | H10N 50/10 |
| | | | | 257/E27.005 |
| 7,486,552 | B2 * | 2/2009 | Apalkov ............... | G11C 11/161 |
| | | | | 365/158 |
| 8,432,009 | B2 | 4/2013 | Apalkov et al. | |
| 9,129,691 | B2 * | 9/2015 | Khalili Amiri ....... | G11C 11/161 |
| 9,324,939 | B2 | 4/2016 | Park et al. | |
| 9,490,000 | B2 | 11/2016 | Apalkov et al. | |
| 9,741,926 | B1 | 8/2017 | Pinarbasi et al. | |
| 9,741,927 | B2 | 8/2017 | Apalkov et al. | |

(Continued)

FOREIGN PATENT DOCUMENTS

| | | |
|---|---|---|
| KR | 2019/0047610 A | 5/2019 |
| KR | 2019/0062137 A | 6/2019 |

(Continued)

*Primary Examiner* — Viet Q Nguyen
(74) *Attorney, Agent, or Firm* — Fish & Richardson P.C.

(57) ABSTRACT

A magnetic tunnel junction device includes a pinned magnetic layer, a free magnetic layer, and a tunnel barrier layer between the pinned and free magnetic layers. The free magnetic layer includes a first free layer, a second free layer spaced apart from the tunnel barrier layer with the first free layer therebetween, and a spacer layer between the first free layer and the second free layer. The first free layer and the second free layer are antiferromagnetically coupled to each other by the spacer layer, and each of the first free layer and the second free layer has a magnetization direction substantially perpendicular to an interface between the free magnetic layer and the tunnel barrier layer. A thermal stability of the free magnetic layer is in a range of 0 to 15.

17 Claims, 6 Drawing Sheets

(56)    References Cited

U.S. PATENT DOCUMENTS

| | | | |
|---|---|---|---|
| 10,056,126 B1 | | 8/2018 | Katti |
| 10,170,695 B2 * | | 1/2019 | Sonobe .................. H10B 61/22 |
| 10,203,380 B2 * | | 2/2019 | Jung .................... G01R 33/093 |
| 10,381,553 B2 * | | 8/2019 | Pinarbasi .............. G11C 11/161 |
| 10,522,739 B2 * | | 12/2019 | Oguz ..................... H10N 50/85 |
| 10,553,642 B2 | | 2/2020 | Lee et al. |
| 10,566,042 B2 | | 2/2020 | Machida et al. |
| 10,586,579 B2 | | 3/2020 | Wang et al. |
| 10,651,370 B2 * | | 5/2020 | Pinarbasi .............. H10N 50/80 |
| 10,840,435 B2 | | 11/2020 | Sonobe et al. |
| 11,121,309 B2 | | 9/2021 | Lee et al. |
| 12,082,508 B2 * | | 9/2024 | Park ....................... H10N 50/10 |
| 2014/0169082 A1 * | | 6/2014 | Worledge ............. G11C 11/161 |
| | | | 365/158 |
| 2019/0164587 A1 * | | 5/2019 | Machida .............. G11C 11/161 |
| 2021/0135091 A1 * | | 5/2021 | Park ................... H01F 10/3263 |

FOREIGN PATENT DOCUMENTS

| | | |
|---|---|---|
| KR | 2020/0050839 A | 5/2020 |
| KR | 2021/0040229 A | 4/2021 |

* cited by examiner

MAGNETIC TUNNEL JUNCTION DEVICE AND STOCHASTIC COMPUTING SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0134185, filed on Oct. 8, 2021 in the Korean Intellectual Property Office, the entire contents of which are hereby incorporated by reference.

BACKGROUND

The present disclosure relates to a magnetic tunnel junction device and/or a stochastic computing system including the same.

A magnetic tunnel junction device may include two magnetic layers and an insulating layer disposed between the two magnetic layers. A resistance value of the magnetic tunnel junction device may be changed according to magnetization directions of the two magnetic layers. For example, the magnetic tunnel junction device may have a high resistance value when the magnetization directions of the two magnetic layers are antiparallel to each other, and the magnetic tunnel junction device may have a low resistance value when the magnetization directions of the two magnetic layers are parallel to each other. Data may be written in and read from the magnetic tunnel junction device by using a difference between these resistance values.

Recently, a spintronics-based stochastic computing system has been suggested. Various techniques for using the magnetic tunnel junction device as a random bit-stream generator of the stochastic computing system have been studied.

SUMMARY

Embodiments of inventive concepts may provide a magnetic tunnel junction device with a reduced relaxation time.

Embodiments of inventive concepts may also provide a stochastic computing system with an improved operating speed.

In an embodiment, a magnetic tunnel junction device may include a pinned magnetic layer, a free magnetic layer, and a tunnel barrier layer between the pinned magnetic layer and the free magnetic layer. The free magnetic layer may include a first free layer, a second free layer spaced apart from the tunnel barrier layer, the first free layer interposed between the tunnel barrier layer and the second free layer, and a spacer layer between the first free layer and the second free layer. The first free layer and the second free layer may be antiferromagnetically coupled to each other by the spacer layer. A magnetization direction of the first free layer and a magnetization direction of the second free layer each may be perpendicular to an interface between the free magnetic layer and the tunnel barrier layer. A thermal stability of the free magnetic layer may be in a range of 0 to 15.

In an embodiment, a magnetic tunnel junction device may include a pinned magnetic layer, a free magnetic layer, and a tunnel barrier layer between the pinned magnetic layer and the free magnetic layer. The free magnetic layer may include a plurality of free layers stacked on the tunnel barrier layer and a plurality of spacer layers between the plurality of free layers, respectively. The plurality of free layers may be antiferromagnetically coupled to each other by the plurality of spacer layers. Each of the plurality of free layers may have a magnetization direction perpendicular to an interface between the free magnetic layer and the tunnel barrier layer. The free magnetic layer may be configured to allow a net magnetization of the free magnetic layer to be 0.

In an embodiment, a stochastic computing system may include a random bit-stream generator including a magnetic tunnel junction device; a write circuit configured to provide a current for generating a bit in the random bit-stream generator; and a read circuit configured to read the bit generated by the random bit-stream generator. The magnetic tunnel junction device may include a pinned magnetic layer, a free magnetic layer, and a tunnel barrier layer between the pinned magnetic layer and the free magnetic layer. The free magnetic layer may include a first free layer, a second free layer spaced apart from the tunnel barrier layer with the first free layer therebetween, and a spacer layer between the first free layer and the second free layer. The first free layer and the second free layer may be antiferromagnetically coupled to each other by the spacer layer. A magnetization direction of the first free layer and a magnetization direction of the second free layer each may be perpendicular to an interface between the free magnetic layer and the tunnel barrier layer. The free magnetic layer may be configured to allow a net magnetization of the free magnetic layer to be 0.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments of inventive concepts will now be described more fully with reference to the accompanying drawings.

Figure 1:
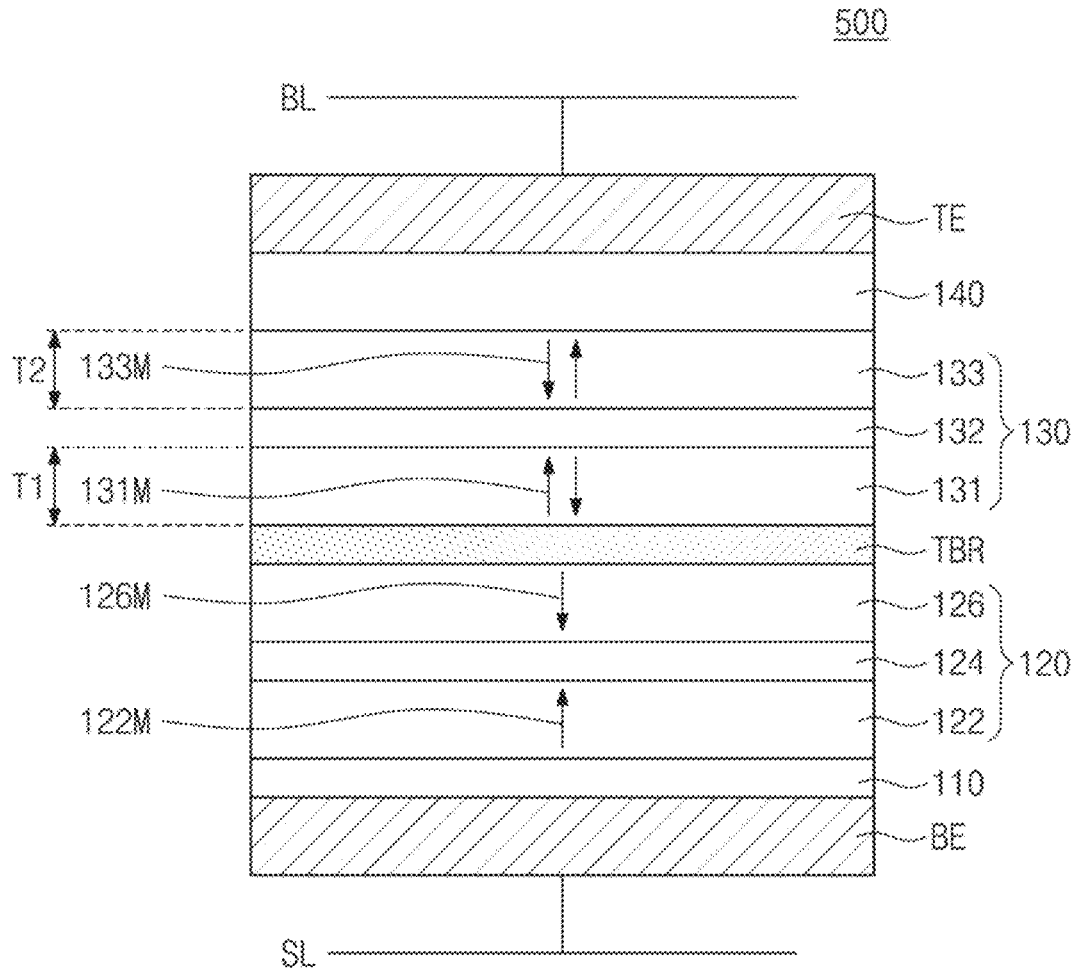
FIG. 1 is a cross-sectional view illustrating a magnetic tunnel junction device according to some embodiments of inventive concepts.

FIG. 1 is a cross-sectional view illustrating a magnetic tunnel junction device according to some embodiments of inventive concepts.

Referring to FIG. 1, a magnetic tunnel junction device 500 may include a pinned magnetic layer 120, a free magnetic layer 130, and a tunnel barrier layer TBR between the pinned and free magnetic layers 120 and 130. The magnetic tunnel junction device 500 may further include a lower electrode BE connected to a source line SL, and an upper electrode TE connected to a bit line BL. In some embodiments, the pinned magnetic layer 120 may be disposed between the lower electrode BE and the tunnel barrier layer TBR, and the free magnetic layer 130 may be disposed between the upper electrode TE and the tunnel barrier layer TBR. The magnetic tunnel junction device 500 may further include a seed layer 110 between the lower electrode BE and the pinned magnetic layer 120, and a capping layer 140 between the upper electrode TE and the free magnetic layer 130.

For example, the lower electrode BE may include a conductive metal nitride (e.g., titanium nitride or tantalum nitride). The upper electrode TE may include at least one of a metal (e.g., Ta, W, Ru, Ir, etc.) or a conductive metal nitride (e.g., TiN). The seed layer 110 may include a material for assisting crystal growth of the pinned magnetic layer 120. For example, the seed layer 110 may include at least one of chromium (Cr), iridium (Ir), or ruthenium (Ru).

The pinned magnetic layer 120 may include a first pinned layer 122, a second pinned layer 126, and an exchange coupling layer 124 between the first and second pinned layers 122 and 126. The first pinned layer 122 may be disposed between the seed layer 110 and the tunnel barrier layer TBR, and the second pinned layer 126 may be disposed between the first pinned layer 122 and the tunnel barrier layer TBR. The exchange coupling layer 124 may be disposed between the first pinned layer 122 and the second pinned layer 126, and the first pinned layer 122 and the second pinned layer 126 may be antiferromagnetically coupled to each other by the exchange coupling layer 124.

The first pinned layer 122 may have a magnetization direction 122M fixed in one direction. The magnetization direction 122M of the first pinned layer 122 may be substantially perpendicular to an interface between the tunnel barrier layer TBR and the free magnetic layer 130. The first pinned layer 122 may include a magnetic element and may include at least one of, for example, iron (Fe), cobalt (Co), or nickel (Ni). The first pinned layer 122 may include at least one of an intrinsic perpendicular magnetic material or an extrinsic perpendicular magnetic material. The intrinsic perpendicular magnetic material may include a material which has a perpendicular magnetization property even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where denotes the number of bilayers. The extrinsic perpendicular magnetic material may include a material which has an intrinsic horizontal magnetization property but has a perpendicular magnetization property by an external factor. For example, the extrinsic perpendicular magnetic material may have the perpendicular magnetization property by magnetic anisotropy induced by a junction of the pinned magnetic layer 120 and the tunnel barrier layer TBR. The extrinsic perpendicular magnetic material may include, for example, CoFeB. In certain embodiments, the first pinned layer 122 may include a Co-based Heusler alloy.

The second pinned layer 126 may have a magnetization direction 126M fixed in one direction. The magnetization direction 126M of the second pinned layer 126 may be substantially perpendicular to the interface between the tunnel barrier layer TBR and the free magnetic layer 130. The second pinned layer 126 may be antiferromagnetically coupled to the first pinned layer 122 by the exchange coupling layer 124, and thus the magnetization direction 126M of the second pinned layer 126 may be antiparallel to the magnetization direction 122M of the first pinned layer 122. The second pinned layer 126 may include a magnetic element and may include at least one of, for example, iron (Fe), cobalt (Co), or nickel (Ni). The second pinned layer 126 may include at least one of the aforementioned intrinsic perpendicular magnetic material or the aforementioned extrinsic perpendicular magnetic material. In certain embodiments, the second pinned layer 126 may include a Co-based Heusler alloy.

The exchange coupling layer 124 may include a non-magnetic metal. For example, the exchange coupling layer 124 may include ruthenium (Ru), iridium (Ir), tungsten (W), tantalum (Ta), or any alloy thereof.

The tunnel barrier layer TBR may include a metal oxide layer. The tunnel barrier layer TBR may include at least one of, for example, a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

The free magnetic layer 130 may include a first free layer 131, a second free layer 133, and a spacer layer 132 between the first and second free layers 131 and 133. The first free layer 131 may be disposed adjacent to the tunnel barrier layer TBR, and the second free layer 133 may be spaced apart from the tunnel barrier layer TBR with the first free layer 131 interposed therebetween. The first free layer 131 may be disposed between the tunnel barrier layer TBR and the capping layer 140, and the second free layer 133 may be disposed between the first free layer 131 and the capping layer 140. The spacer layer 132 may be disposed between the first free layer 131 and the second free layer 133, and the first free layer 131 and the second free layer 133 may be antiferromagnetically coupled to each other by the spacer layer 132.

The first free layer 131 may have a magnetization direction 131M changeable to be parallel or antiparallel to the magnetization direction 126M of the second pinned layer 126. The magnetization direction 131M of the first free layer 131 may be substantially perpendicular to the interface between the tunnel barrier layer TBR and the free magnetic layer 130 (e.g., the first free layer 131). The first free layer 131 may include a magnetic element and may include at least one of, for example, iron (Fe), cobalt (Co), or nickel (Ni). The first free layer 131 may include at least one of the perpendicular magnetic material (e.g., CoFeTb, CoFeGd, CoFeDy), the perpendicular magnetic material having the $L1_0$ structure, the CoPt alloy having the HCP lattice structure, or the perpendicular magnetic structure. The first free layer 131 may include a magnetic material (e.g., CoFeB) which has a perpendicular magnetic property by magnetic anisotropy induced by a junction of the free magnetic layer 130 (e.g., the first free layer 131) and the tunnel barrier layer TBR. In certain embodiments, the first free layer 131 may include a Co-based Heusler alloy.

The second free layer 133 may have a changeable magnetization direction 133M, and the magnetization direction 133M of the second free layer 133 may be substantially perpendicular to the interface between the tunnel barrier layer TBR and the free magnetic layer 130 (e.g., the first free layer 131). The second free layer 133 may be antiferromagnetically coupled to the first free layer 131 by the spacer layer 132, and thus the magnetization direction 133M of the second free layer 133 may be antiparallel to the magnetization direction 131M of the first free layer 131. The second free layer 133 may include a magnetic element and may include at least one of, for example, iron (Fe), cobalt (Co), or nickel (Ni). The second free layer 133 may include at least one of the perpendicular magnetic material (e.g., CoFeTb, CoFeGd, CoFeDy), the perpendicular magnetic material having the $L1_0$ structure, the CoPt alloy having the HCP lattice structure, or the perpendicular magnetic structure. The second free layer 133 may include a magnetic material (e.g., CoFeB) which has a perpendicular magnetic property by magnetic anisotropy induced by a junction of the free magnetic layer 130 (e.g., the first free layer 131) and the tunnel barrier layer TBR. In certain embodiments, the second free layer 133 may include a Co-based Heusler alloy.

The spacer layer 132 may include a non-magnetic metal. For example, the spacer layer 132 may include ruthenium (Ru), iridium (Ir), tungsten (W), tantalum (Ta), or any alloy thereof.

The capping layer 140 may include a non-magnetic metal. For example, the capping layer 140 may include ruthenium (Ru), molybdenum (Mo), iridium (Ir), tungsten (W), tantalum (Ta), or any alloy thereof.

The pinned magnetic layer 120 may be configured to have a thermal stability of 40 or more (for example, ranges from 40 to 1000), and the free magnetic layer 130 may be configured to have a thermal stability of 15 or less. The thermal stability may be represented by the following formula 1.

$$\Delta = E_B/k_B T \qquad \text{[Formula 1]}$$

Here, '$\Delta$' is the thermal stability, '$E_B$' is an energy barrier required for magnetization reversal, '$k_B$' is a Boltzmann constant, and 'T' is an absolute temperature.

The energy barrier $E_B$ may be represented by the following formula 2.

$$E_B = K_{eff} V \qquad \text{[Formula 2]}$$

Here, '$K_{eff}$' is an effective magnetic anisotropy energy density of a magnetic layer, and 'V' is a volume of the magnetic layer.

Each of the first pinned layer 122 and the second pinned layer 126 may be configured to have the thermal stability $\Delta$ of 40 or more (for example, ranges from 40 to 1000). For example, each of the first pinned layer 122 and the second pinned layer 126 may be formed of a material having a relatively great perpendicular magnetic anisotropy energy. In this case, the effective magnetic anisotropy energy density $K_{eff}$ of each of the first pinned layer 122 and the second pinned layer 126 may be increased, and thus the energy barrier $E_B$ of each of the first pinned layer 122 and the second pinned layer 126 may be increased. The energy barrier $E_B$ of each of the first pinned layer 122 and the second pinned layer 126 may be adjusted in such a way that the thermal stability $\Delta$ of each of the first pinned layer 122 and the second pinned layer 126 is 40 or more. For example, the adjusting of the energy barrier $E_B$ of each of the first pinned layer 122 and the second pinned layer 126 may include adjusting the effective magnetic anisotropy energy density $K_{eff}$ of each of the first pinned layer 122 and the second pinned layer 126.

Each of the first free layer 131 and the second free layer 133 may be configured to have the thermal stability $\Delta$ of 15 or less. For example, each of the first free layer 131 and the second free layer 133 may be formed of a material having a relatively small perpendicular magnetic anisotropy energy. In this case, the effective magnetic anisotropy energy density $K_{eff}$ of each of the first free layer 131 and the second free layer 133 may be reduced, and thus the energy barrier $E_B$ of each of the first free layer 131 and the second free layer 133 may be reduced. The energy barrier $E_B$ of each of the first free layer 131 and the second free layer 133 may be adjusted in such a way that the thermal stability $\Delta$ of each of the first free layer 131 and the second free layer 133 is 15 or less. For example, the adjusting of the energy barrier $E_B$ of each of the first free layer 131 and the second free layer 133 may include adjusting the effective magnetic anisotropy energy density $K_{eff}$ of each of the first free layer 131 and the second free layer 133.

When the free magnetic layer 130 includes the first free layer 131 and the second free layer 133 which are antiferromagnetically coupled to each other, the energy barrier $E_B$ of the free magnetic layer 130 may be represented by the following formula 3.

$$E_B = [K1 T1 + K2 T2 - \tfrac{1}{2}(Ms1 Ms2(Nz - Nx)(T1 + T2))]A \qquad \text{[Formula 3]}$$

Here, 'K1' is a magnetic anisotropy constant of the first free layer 131, 'K2' is a magnetic anisotropy constant of the second free layer 133, 'T1' is a thickness of the first free layer 131, 'T2' is a thickness of the second free layer 133, 'Ms1' is a saturation magnetization of the first free layer 131, 'Ms2' is a saturation magnetization of the second free layer 133, '(Nz−Nx)' is a demagnetizing tensor between the first free layer 131 and the second free layer 133, and 'A' is an area of a top surface of the free magnetic layer 130 when viewed in a plan view.

The energy barrier $E_B$ of the free magnetic layer 130 may be adjusted in such a way that the thermal stability $\Delta$ of the free magnetic layer 130 is 15 or less. For example, the adjusting of the energy barrier $E_B$ of the free magnetic layer 130 may include adjusting the magnetic anisotropy constant, the saturation magnetization and the thickness of each of the first free layer 131 and the second free layer 133, and adjusting the area of the top surface of the free magnetic layer 130, as shown in the formula 3.

For example, the free magnetic layer 130 may be configured to have the thermal stability $\Delta$ in a range of 0 to 15. The thermal stability $\Delta$ of the free magnetic layer 130 may be greater than 0 and less than 15. For example, the thermal stability $\Delta$ of the free magnetic layer 130 may be equal to or greater than 1 and equal to or less than 11. For example, each of the first free layer 131 and the second free layer 133 may be configured to have the thermal stability Δ in a range of 0 to 15. The thermal stability Δ of each of the first free layer 131 and the second free layer 133 may be greater than 0 and less than 15. For example, the thermal stability Δ of each of the first free layer 131 and the second free layer 133 may be equal to or greater than 1 and equal to or less than 11.

Since the free magnetic layer 130 is configured to have the relatively low thermal stability Δ, a relaxation time of the magnetic tunnel junction device 500 may be reduced. The relaxation time may mean a time for which data written in the magnetic tunnel junction device 500 is retained. For example, since each of the first free layer 131 and the second free layer 133 is configured to have the relatively low thermal stability Δ, a time (e.g., the relaxation time) for which the magnetization direction 131M/133M of each of the first and second free layers 131 and 133 remains in parallel or antiparallel to the magnetization direction 126M of the second pinned layer 126 may be reduced. The relaxation time of the magnetic tunnel junction device 500 may determine an operating speed of a stochastic computing system to be described later. Since the relaxation time of the magnetic tunnel junction device 500 is reduced, the operating speed of the stochastic computing system may be increased.

The free magnetic layer 130 may be configured to allow a net magnetization Mst of the free magnetic layer 130 to be reduced. For example, the free magnetic layer 130 may be configured in such a way that the net magnetization Mst of the free magnetic layer 130 is 0 (zero). When the free magnetic layer 130 includes a plurality of free layers, the net magnetization Mst of the free magnetic layer 130 may satisfy a condition of the following formula 4.

$$Mst = \sum_{i=1}^{n} MsiTi = 0 \qquad \text{[Formula 4]}$$

Here, 'Msi' is a saturation magnetization of each of the plurality of free layers, and 'Ti' is a thickness of each of the plurality of free layers, and 'n' is the number of the plurality of free layers.

For example, when the free magnetic layer 130 includes the first free layer 131 and the second free layer 133 (e.g., n=2 in the formula 4), the net magnetization Mst of the free magnetic layer 130 may satisfy a condition of the following formula 5.

$$Mst = Ms1T1 + Ms2T2 = 0 \qquad \text{[Formula 5]}$$

Here, 'Ms1' and 'T1' are a saturation magnetization and a thickness of the first free layer 131, respectively, and 'Ms2' and 'T2' are a saturation magnetization and a thickness of the second free layer 133, respectively. The thickness T1 of the first free layer 131 and the thickness T2 of the second free layer 133 may be measured in a direction perpendicular to the interface between the tunnel barrier layer TBR and the free magnetic layer 130 (e.g., the first free layer 131). The saturation magnetization Ms1 and the thickness T1 of the first free layer 131 and the saturation magnetization Ms2 and the thickness T2 of the second free layer 133 may be adjusted in such a way that the net magnetization Mst of the free magnetic layer 130 is 0.

Since the free magnetic layer 130 is configured to allow the net magnetization Mst to be reduced (e.g., to allow the net magnetization Mst to be 0), a demagnetization field of the free magnetic layer 130 may be reduced, and thus the relaxation time of the magnetic tunnel junction device 500 may be reduced.

According to embodiments of inventive concepts, the free magnetic layer 130 may include the first free layer 131 and the second free layer 133, which are antiferromagnetically coupled to each other, and the magnetization directions 131M and 133M of the first free layer 131 and the second free layer 133 may be substantially perpendicular to the interface between the tunnel barrier layer TBR and the free magnetic layer 130 (e.g., the first free layer 131). The energy barrier $E_B$ of each of the first and second free layers 131 and 133 or the energy barrier $E_B$ of the free magnetic layer 130 may be adjusted in such a way that the thermal stability Δ of the free magnetic layer 130 is 15 or less (e.g., 0 to 15). In addition, the saturation magnetization Ms1/Ms2 and the thickness T1/T2 of each of the first and second free layers 131 and 133 may be adjusted in such a way that the net magnetization Mst of the free magnetic layer 130 is 0. Thus, the relaxation time of the magnetic tunnel junction device 500 may be reduced, and as a result, the operating speed of the stochastic computing system including the magnetic tunnel junction device 500 may be increased.

Figure 2:
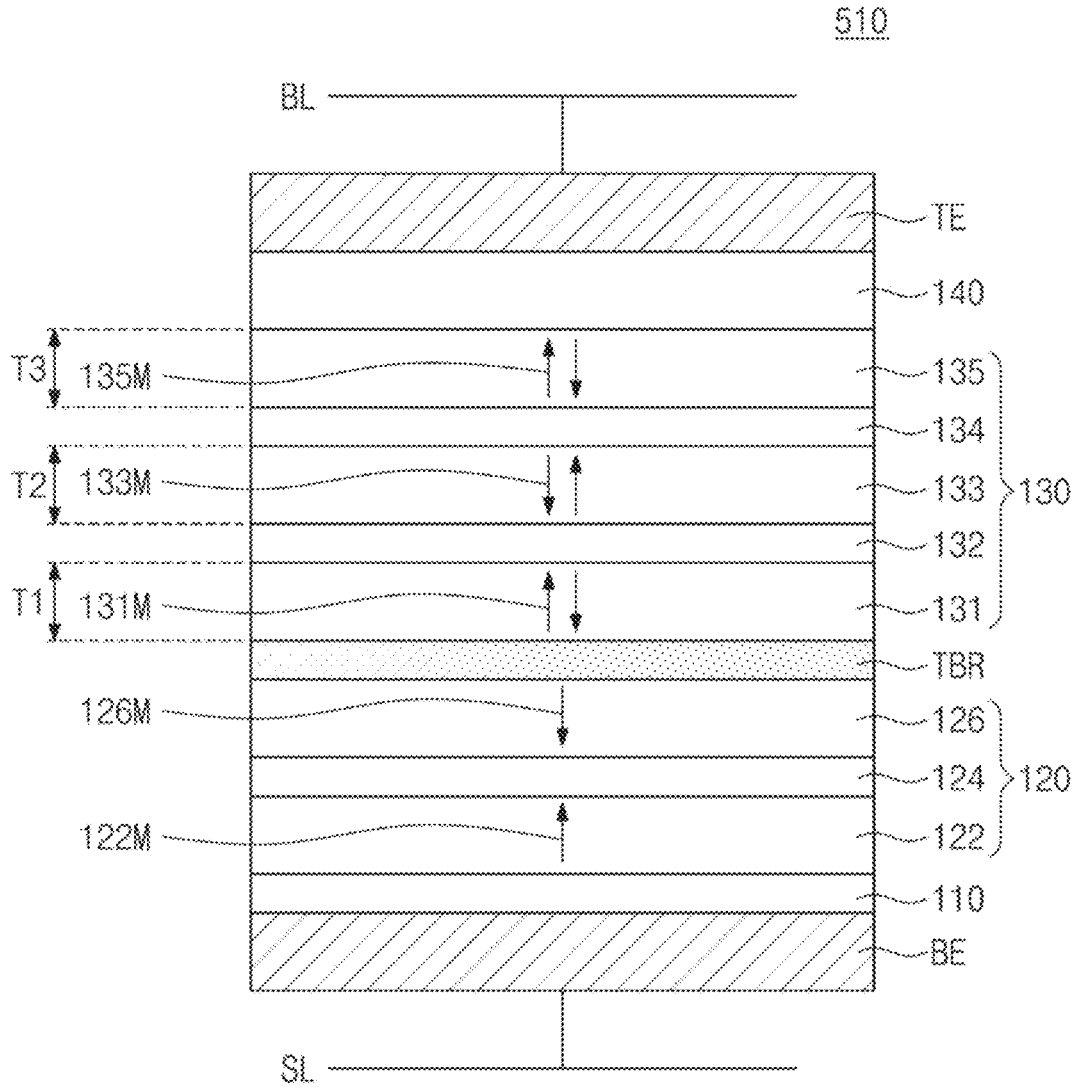
FIG. 2 is a cross-sectional view illustrating a magnetic tunnel junction device according to some embodiments of inventive concepts.

FIG. 2 is a cross-sectional view illustrating a magnetic tunnel junction device according to some embodiments of inventive concepts. Hereinafter, differences between the present embodiment and the embodiment of FIG. 1 will be mainly described for the purpose of ease and convenience in explanation.

Referring to FIG. 2, a magnetic tunnel junction device 510 may include a pinned magnetic layer 120, a free magnetic layer 130, and a tunnel barrier layer TBR between the pinned and free magnetic layers 120 and 130. The magnetic tunnel junction device 510 may further include a lower electrode BE connected to a source line SL, and an upper electrode TE connected to a bit line BL. In some embodiments, the pinned magnetic layer 120 may be disposed between the lower electrode BE and the tunnel barrier layer TBR, and the free magnetic layer 130 may be disposed between the upper electrode TE and the tunnel barrier layer TBR. The magnetic tunnel junction device 510 may further include a seed layer 110 between the lower electrode BE and the pinned magnetic layer 120, and a capping layer 140 between the upper electrode TE and the free magnetic layer 130.

The free magnetic layer 130 may include a first free layer 131, a second free layer 133 and a third free layer 135 which are sequentially stacked on the tunnel barrier layer TBR; a first spacer layer 132 between the first free layer 131 and the second free layer 133; and a second spacer layer 134 between the second free layer 133 and the third free layer 135. The first free layer 131 may be disposed between the tunnel barrier layer TBR and the capping layer 140, and the second free layer 133 may be disposed between the first free layer 131 and the capping layer 140. The third free layer 135 may be disposed between the second free layer 133 and the capping layer 140. The first spacer layer 132 may be disposed between the first free layer 131 and the second free layer 133, and the first free layer 131 and the second free layer 133 may be antiferromagnetically coupled to each other by the first spacer layer 132. The second spacer layer 134 may be disposed between the second free layer 133 and the third free layer 135, and the second free layer 133 and the third free layer 135 may be antiferromagnetically coupled to each other by the second spacer layer 134.

The first free layer 131, the first spacer layer 132 and the second free layer 133 may be substantially the same as the first free layer 131, the spacer layer 132 and the second free layer 133 described with reference to FIG. 1, respectively.

The third free layer 135 may have a changeable magnetization direction 135M, and the magnetization direction 135M of the third free layer 135 may be substantially perpendicular to the interface between the tunnel barrier layer TBR and the free magnetic layer 130 (e.g., the first free layer 131). The third free layer 135 may be antiferromagnetically coupled to the second free layer 133 by the second spacer layer 134, and thus the magnetization direction 135M of the third free layer 135 may be antiparallel to the magnetization direction 133M of the second free layer 133. The third free layer 135 may include a magnetic element and may include at least one of, for example, iron (Fe), cobalt (Co), or nickel (Ni). The third free layer 135 may include at least one of the perpendicular magnetic material (e.g., CoFeTb, CoFeGd, CoFeDy), the perpendicular magnetic material having the $L1_0$ structure, the CoPt alloy having the HCP lattice structure, or the perpendicular magnetic structure. The third free layer 135 may include a magnetic material (e.g., CoFeB) which has a perpendicular magnetic property by magnetic anisotropy induced by a junction of the free magnetic layer 130 (e.g., the first free layer 131) and the tunnel barrier layer TBR. In certain embodiments, the third free layer 135 may include a Co-based Heusler alloy.

The second spacer layer 134 may include a non-magnetic metal. For example, the second spacer layer 134 may include ruthenium (Ru), iridium (Ir), tungsten (W), tantalum (Ta), or any alloy thereof.

The free magnetic layer 130 may be configured to have a thermal stability $\Delta$ of 15 or less (e.g., in a range of 0 to 15). For example, each of the first to third free layers 131, 133 and 135 may be configured to have the thermal stability $\Delta$ of 15 or less (e.g., in a range of 0 to 15). As described with reference to the formula 1 and the formula 2, the energy barrier $E_B$ of each of the first to third free layers 131, 133 and 135 may be adjusted in such a way that the thermal stability $\Delta$ of each of the first to third free layers 131, 133 and 135 is 15 or less (e.g., in a range of 0 to 15). The thermal stability $\Delta$ of each of the first to third free layers 131, 133 and 135 may be greater than 0 and less than 15. For example, the thermal stability $\Delta$ of each of the first to third free layers 131, 133 and 135 may be equal to or greater than 1 and equal to or less than 11.

The free magnetic layer 130 may be configured to allow a net magnetization Mst of the free magnetic layer 130 to be reduced. For example, the free magnetic layer 130 may be configured in such a way that the net magnetization Mst of the free magnetic layer 130 is 0 (zero). For example, when the free magnetic layer 130 includes the first free layer 131, the second free layer 133 and the third free layer 135 (e.g., n=3 in the formula 4), the net magnetization Mst of the free magnetic layer 130 may satisfy a condition of the following formula 6.

$$Mst=Ms1T1+Ms2T2+Ms3T3=0 \qquad \text{[Formula 6]}$$

Here, 'Ms1' and 'T1' are a saturation magnetization and a thickness of the first free layer 131, respectively, 'Ms2' and 'T2' are a saturation magnetization and a thickness of the second free layer 133, respectively, and 'Ms3' and 'T3' are a saturation magnetization and a thickness of the third free layer 135, respectively. The thickness T1 of the first free layer 131, the thickness T2 of the second free layer 133 and the thickness T3 of the third free layer 135 may be measured in the direction perpendicular to the interface between the tunnel barrier layer TBR and the free magnetic layer 130 (e.g., the first free layer 131). The saturation magnetization Ms1 and the thickness T1 of the first free layer 131, the saturation magnetization Ms2 and the thickness T2 of the second free layer 133 and the saturation magnetization Ms3 and the thickness T3 of the third free layer 135 may be adjusted in such a way that the net magnetization Mst of the free magnetic layer 130 is 0.

Except for the differences described above, other features and components of the magnetic tunnel junction device 510 according to the present embodiment may be substantially the same as corresponding features and components of the magnetic tunnel junction device 500 described with reference to FIG. 1.

Figure 3:
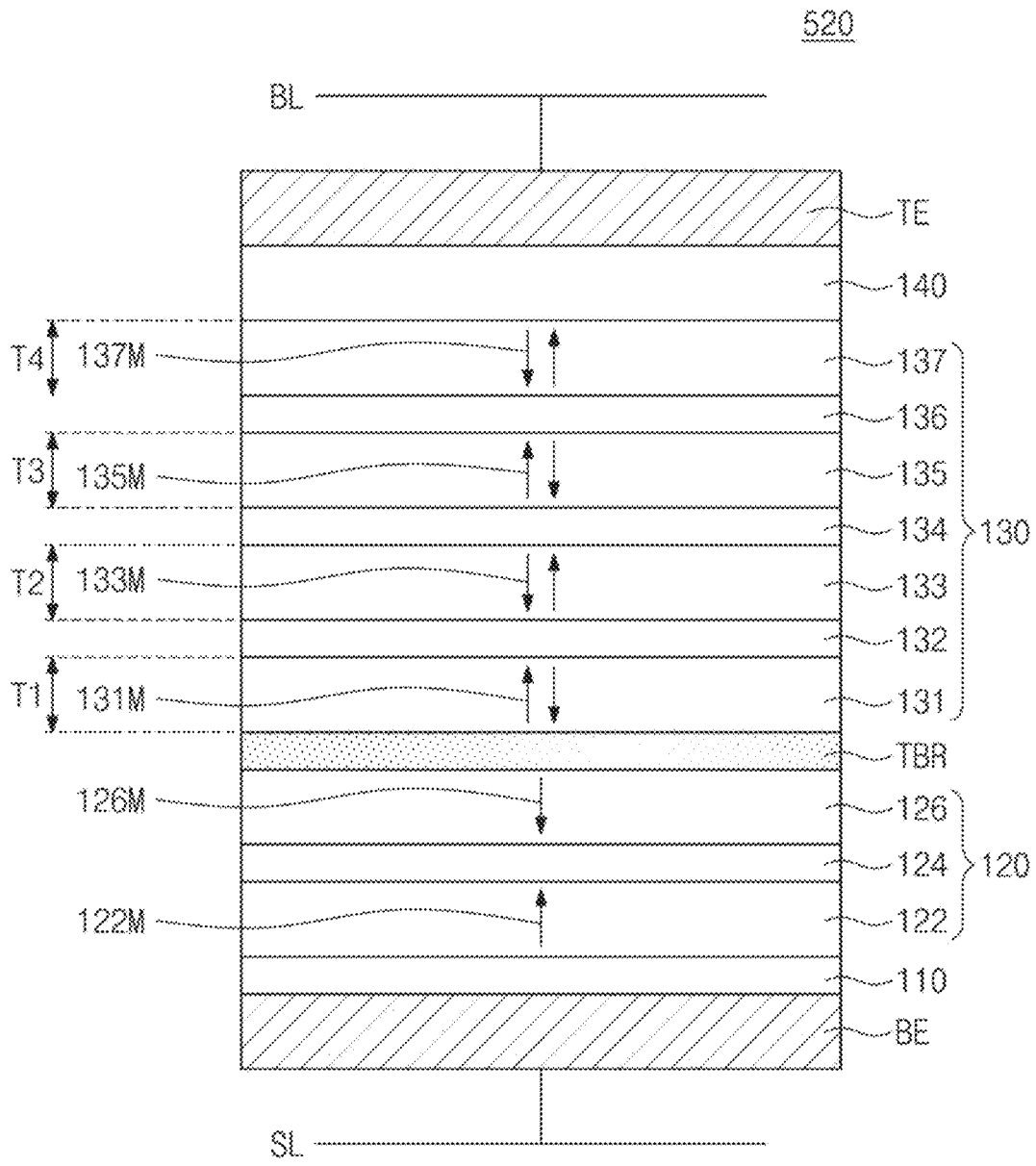
FIG. 3 is a cross-sectional view illustrating a magnetic tunnel junction device according to some embodiments of inventive concepts.

FIG. 3 is a cross-sectional view illustrating a magnetic tunnel junction device according to some embodiments of inventive concepts. Hereinafter, differences between the present embodiment and the embodiments of FIGS. 1 and 2 will be mainly described for the purpose of ease and convenience in explanation.

Referring to FIG. 3, a magnetic tunnel junction device 520 may include a pinned magnetic layer 120, a free magnetic layer 130, and a tunnel barrier layer TBR between the pinned and free magnetic layers 120 and 130. The magnetic tunnel junction device 520 may further include a lower electrode BE connected to a source line SL, and an upper electrode TE connected to a bit line BL. In some embodiments, the pinned magnetic layer 120 may be disposed between the lower electrode BE and the tunnel barrier layer TBR, and the free magnetic layer 130 may be disposed between the upper electrode TE and the tunnel barrier layer TBR. The magnetic tunnel junction device 520 may further include a seed layer 110 between the lower electrode BE and the pinned magnetic layer 120, and a capping layer 140 between the upper electrode TE and the free magnetic layer 130.

The free magnetic layer 130 may include a first free layer 131, a second free layer 133, a third free layer 135 and a fourth free layer 137 which are sequentially stacked on the tunnel barrier layer TBR; a first spacer layer 132 between the first free layer 131 and the second free layer 133; a second spacer layer 134 between the second free layer 133 and the third free layer 135; and a third spacer layer 136 between the third free layer 135 and the fourth free layer 137. The first free layer 131 may be disposed between the tunnel barrier layer TBR and the capping layer 140, and the second free layer 133 may be disposed between the first free layer 131 and the capping layer 140. The third free layer 135 may be disposed between the second free layer 133 and the capping layer 140, and the fourth free layer 137 may be disposed between the third free layer 135 and the capping layer 140. The first spacer layer 132 may be disposed between the first free layer 131 and the second free layer 133, and the first free layer 131 and the second free layer 133 may be antiferromagnetically coupled to each other by the first spacer layer 132. The second spacer layer 134 may be disposed between the second free layer 133 and the third free layer 135, and the second free layer 133 and the third free layer 135 may be antiferromagnetically coupled to each other by the second spacer layer 134. The third spacer layer 136 may be disposed between the third free layer 135 and the fourth free layer 137, and the third free layer 135 and the fourth free layer 137 may be antiferromagnetically coupled to each other by the third spacer layer 136.

The first free layer 131, the first spacer layer 132 and the second free layer 133 may be substantially the same as the first free layer 131, the spacer layer 132 and the second free layer 133 described with reference to FIG. 1, respectively. The third free layer 135 and the second spacer layer 134 may be substantially the same as the third free layer 135 and the second spacer layer 134 described with reference to FIG. 2.

The fourth free layer 137 may have a changeable magnetization direction 137M, and the magnetization direction 137M of the fourth free layer 137 may be substantially perpendicular to the interface between the tunnel barrier layer TBR and the free magnetic layer 130 (e.g., the first free layer 131). The fourth free layer 137 may be antiferromagnetically coupled to the third free layer 135 by the third spacer layer 136, and thus the magnetization direction 137M of the fourth free layer 137 may be antiparallel to the magnetization direction 135M of the third free layer 135. The fourth free layer 137 may include a magnetic element and may include at least one of, for example, iron (Fe), cobalt (Co), or nickel (Ni). The fourth free layer 137 may include at least one of the perpendicular magnetic material (e.g., CoFeTb, CoFeGd, CoFeDy), the perpendicular magnetic material having the $L1_0$ structure, the CoPt alloy having the HCP lattice structure, or the perpendicular magnetic structure. The fourth free layer 137 may include a magnetic material (e.g., CoFeB) which has a perpendicular magnetic property by magnetic anisotropy induced by a junction of the free magnetic layer 130 (e.g., the first free layer 131) and the tunnel barrier layer TBR. In certain embodiments, the fourth free layer 137 may include a Co-based Heusler alloy.

The third spacer layer 136 may include a non-magnetic metal. For example, the third spacer layer 136 may include ruthenium (Ru), iridium (Ir), tungsten (W), tantalum (Ta), or any alloy thereof.

The free magnetic layer 130 may be configured to have a thermal stability Δ of 15 or less (e.g., in a range of 0 to 15). For example, each of the first to fourth free layers 131, 133, 135 and 137 may be configured to have the thermal stability Δ of 15 or less (e.g., in a range of 0 to 15). As described with reference to the formula 1 and the formula 2, the energy barrier $E_B$ of each of the first to fourth free layers 131, 133, 135 and 137 may be adjusted in such a way that the thermal stability Δ of each of the first to fourth free layers 131, 133, 135 and 137 is 15 or less (e.g., in a range of 0 to 15). The thermal stability Δ of each of the first to fourth free layers 131, 133, 135 and 137 may be greater than 0 and less than 15. For example, the thermal stability Δ of each of the first to fourth free layers 131, 133, 135 and 137 may be equal to or greater than 1 and equal to or less than 11.

The free magnetic layer 130 may be configured to allow a net magnetization Mst of the free magnetic layer 130 to be reduced. For example, the free magnetic layer 130 may be configured in such a way that the net magnetization Mst of the free magnetic layer 130 is 0 (zero). For example, when the free magnetic layer 130 includes the first free layer 131, the second free layer 133, the third free layer 135 and the fourth free layer 137 (e.g., n=4 in the formula 4), the net magnetization Mst of the free magnetic layer 130 may satisfy a condition of the following formula 7.

$$Mst=Ms1T1+Ms2T2+Ms3T3+Ms4T4=0 \qquad \text{[Formula 7]}$$

Here, 'Ms1' and 'T1' are a saturation magnetization and a thickness of the first free layer 131, respectively, 'Ms2' and 'T2' are a saturation magnetization and a thickness of the second free layer 133, respectively, 'Ms3' and 'T3' are a saturation magnetization and a thickness of the third free layer 135, respectively, and 'Ms4' and 'T4' are a saturation magnetization and a thickness of the fourth free layer 137, respectively. The thickness T1 of the first free layer 131 the thickness T2 of the second free layer 133, the thickness T3 of the third free layer 135 and the thickness T4 of the fourth free layer 137 may be measured in the direction perpendicular to the interface between the tunnel barrier layer TBR and the free magnetic layer 130 (e.g., the first free layer 131). The saturation magnetization Ms1 and the thickness T1 of the first free layer 131, the saturation magnetization Ms2 and the thickness T2 of the second free layer 133, the saturation magnetization Ms3 and the thickness T3 of the third free layer 135, and the saturation magnetization Ms4 and the thickness T4 of the fourth free layer 137 may be adjusted in such a way that the net magnetization Mst of the free magnetic layer 130 is 0.

Except for the differences described above, other features and components of the magnetic tunnel junction device 520 according to the present embodiment may be substantially the same as corresponding features and components of the magnetic tunnel junction devices 500 and 510 described with reference to FIGS. 1 and 2.

The free magnetic layer 130 may have a synthetic antiferromagnetic (SAF) structure including two free layers (e.g., the first and second free layers 131 and 133) like FIG. 1, a synthetic antiferromagnetic structure including three free layers (e.g., the first to third free layers 131, 133 and 135) like FIG. 2, or a synthetic antiferromagnetic structure including four free layers (e.g., the first to fourth free layers 131, 133, 135 and 137) like FIG. 3. However, embodiments of inventive concepts are not limited thereto.

In certain embodiments, the free magnetic layer 130 may have a synthetic antiferromagnetic structure including a plurality of free layers (e.g., five or more free layers) and a plurality of spacer layers disposed between the plurality of free layers, respectively. The plurality of free layers may be antiferromagnetically coupled to each other by the plurality of spacer layers. Each of the plurality of free layers may have a magnetization direction substantially perpendicular to the interface between the free magnetic layer 130 and the tunnel barrier layer TBR. In this case, the free magnetic layer 130 may be configured to have a thermal stability Δ of 15 or less (e.g., in a range of 0 to 15). For example, each of the plurality of free layers may be configured to have the thermal stability Δ of 15 or less (e.g., in a range of 0 to 15). As described with reference to the formula 1 and the formula 2, the energy barrier $E_B$ of each of the plurality of free layers may be adjusted in such a way that the thermal stability Δ of each of the plurality of free layers is 15 or less (e.g., in a range of 0 to 15). In addition, the free magnetic layer 130 may be configured to allow a net magnetization Mst of the free magnetic layer 130 to be reduced. For example, the free magnetic layer 130 may be configured in such a way that the net magnetization Mst of the free magnetic layer 130 is 0 (zero). As described with reference to the formula 4, a saturation magnetization Ms, and a thickness $T_i$ of each of the plurality of free layers may be adjusted in such a way that the net magnetization Mst of the free magnetic layer 130 is 0.

Figure 4:
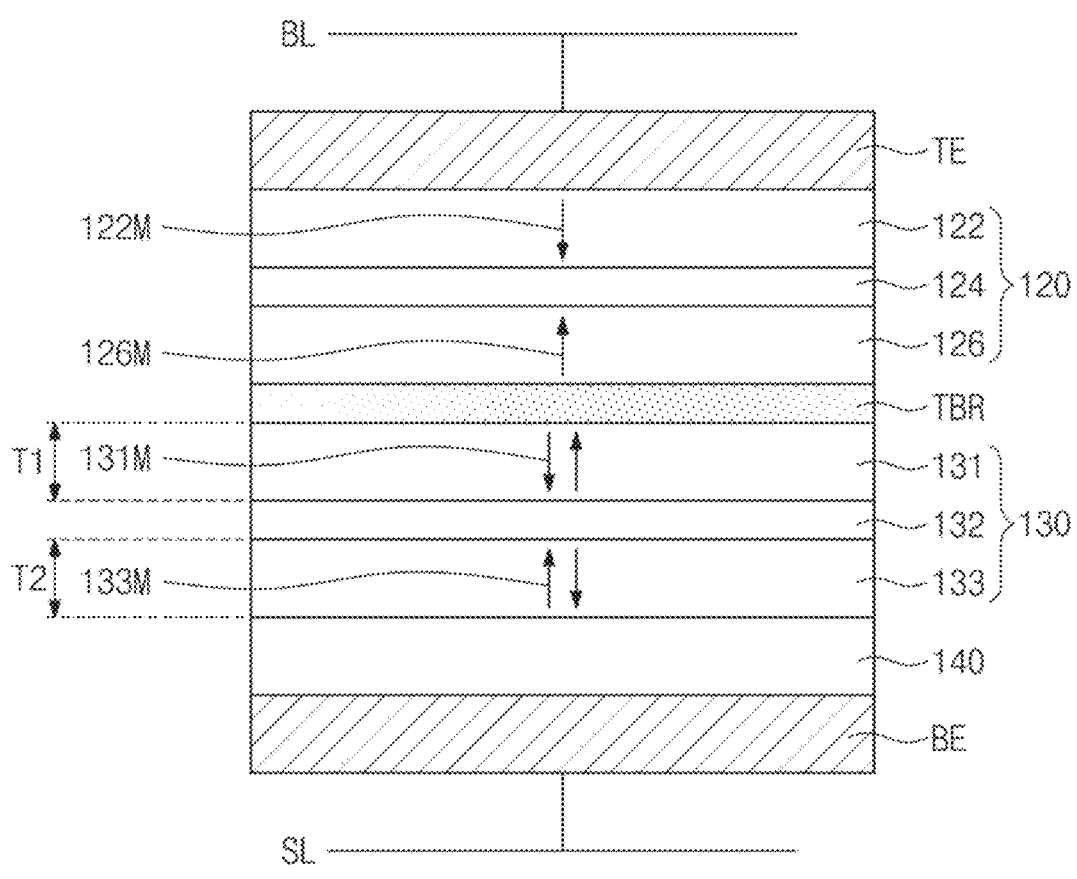
FIG. 4 is a cross-sectional view illustrating a magnetic tunnel junction device according to some embodiments of inventive concepts.

FIG. 4 is a cross-sectional view illustrating a magnetic tunnel junction device according to some embodiments of inventive concepts. Hereinafter, differences between the present embodiment and the embodiments of FIG. 1 will be mainly described for the purpose of ease and convenience in explanation.

Referring to FIG. 4, a magnetic tunnel junction device 530 may include a pinned magnetic layer 120, a free magnetic layer 130, and a tunnel barrier layer TBR between the pinned and free magnetic layers 120 and 130. The magnetic tunnel junction device 530 may further include a lower electrode BE connected to a source line SL, and an upper electrode TE connected to a bit line BL. In some embodiments, the free magnetic layer 130 may be disposed between the lower electrode BE and the tunnel barrier layer TBR, and the pinned magnetic layer 120 may be disposed between the upper electrode TE and the tunnel barrier layer TBR. The magnetic tunnel junction device 530 may further include a capping layer 140 between the lower electrode BE and the free magnetic layer 130.

The pinned magnetic layer 120 may include a first pinned layer 122, a second pinned layer 126, and an exchange coupling layer 124 between the first and second pinned layers 122 and 126. The first pinned layer 122 may be disposed between the upper electrode TE and the tunnel barrier layer TBR, and the second pinned layer 126 may be disposed between the first pinned layer 122 and the tunnel barrier layer TBR. The exchange coupling layer 124 may be disposed between the first pinned layer 122 and the second pinned layer 126, and the first pinned layer 122 and the second pinned layer 126 may be antiferromagnetically coupled to each other by the exchange coupling layer 124. The first pinned layer 122, the second pinned layer 126 and the exchange coupling layer 124 may be substantially the same as the first pinned layer 122, the second pinned layer 126 and the exchange coupling layer 124 described with reference to FIG. 1, except the arrangement thereof.

The free magnetic layer 130 may include a first free layer 131, a second free layer 133, and a spacer layer 132 between the first and second free layers 131 and 133. The first free layer 131 may be disposed between the tunnel barrier layer TBR and the lower electrode BE, and the second free layer 133 may be disposed between the first free layer 131 and the lower electrode BE. The spacer layer 132 may be disposed between the first free layer 131 and the second free layer 133, and the first free layer 131 and the second free layer 133 may be antiferromagnetically coupled to each other by the spacer layer 132. The capping layer 140 may be disposed between the second free layer 133 and the lower electrode BE. The first free layer 131, the second free layer 133 and the spacer layer 132 may be substantially the same as the first free layer 131, the second free layer 133 and the spacer layer 132 described with reference to FIG. 1, except the arrangement thereof.

Except for the relative arrangement of the pinned magnetic layer 120, the free magnetic layer 130 and the capping layer 140, other features of the magnetic tunnel junction device 530 according to the present embodiment may be substantially the same as corresponding features of the magnetic tunnel junction device 500 described with reference to FIG. 1.

Figure 5:
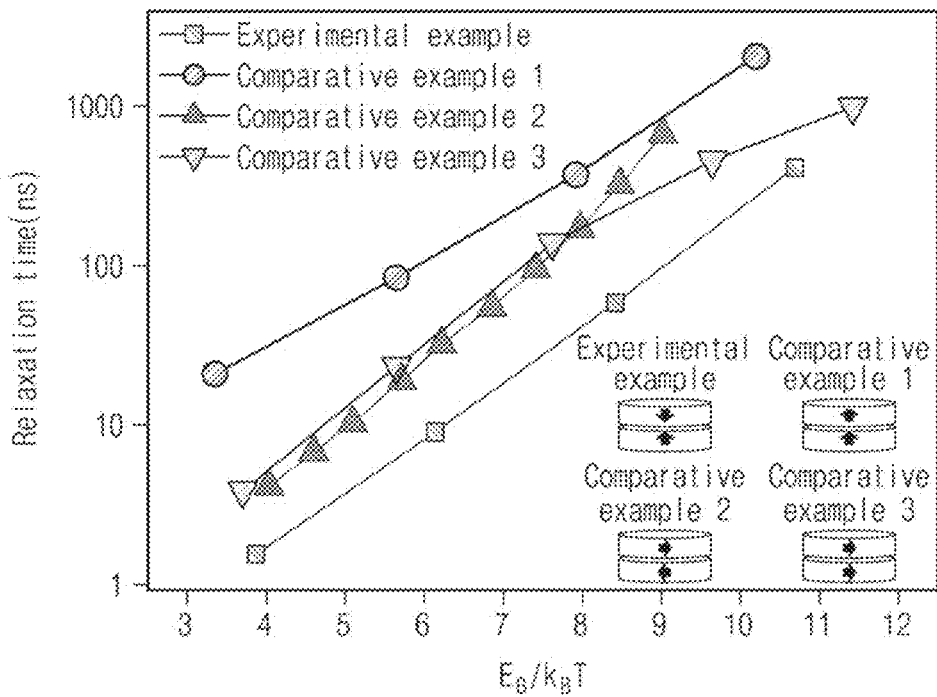
FIG. 5 is a graph showing a relaxation time of a magnetic tunnel junction device according to a structure of a free magnetic layer.

FIG. 5 is a graph showing a relaxation time of a magnetic tunnel junction device according to a structure of a free magnetic layer.

Referring to FIG. 5, a free magnetic layer according to an experimental example may have a synthetic antiferromagnetic (SAF) structure including free layers having perpendicular magnetizations. Hereinafter, as described with reference to FIG. 1, it may be understood that when a component is referred to as having the perpendicular magnetization, it may have a magnetization direction substantially perpendicular to the interface between the free magnetic layer 130 and the tunnel barrier layer TBR. The free magnetic layer according to the experimental example may be substantially the same as the free magnetic layer 130 of FIG. 1. For example, the free magnetic layer according to the experimental example may include the first free layer 131 and the second free layer 133 which are antiferromagnetically coupled to each other, and the magnetization directions 131M and 133M of the first free layer 131 and the second free layer 133 may be substantially perpendicular to the interface between the tunnel barrier layer TBR and the free magnetic layer 130 (e.g., the first free layer 131).

A free magnetic layer according to a comparative example 1 may include free layers having perpendicular magnetizations but may have a structure in which the free layers are ferromagnetically coupled to each other. A free magnetic layer according to a comparative example 2 may have a synthetic antiferromagnetic structure including free layers having horizontal magnetizations. Hereinafter, unlike the descriptions of FIG. 1, it may be understood that when a component is referred to as having the horizontal magnetization, it may have a magnetization direction parallel to the interface between the free magnetic layer 130 and the tunnel barrier layer TBR. A free magnetic layer according to a comparative example 3 may include free layers having horizontal magnetizations but may have a structure in which the free layers are ferromagnetically coupled to each other. Each of the free magnetic layers according to the experimental example and the comparative examples 1 to 3 may be configured to have a thermal stability of 15 or less (e.g., in a range of 0 to 15).

According to FIG. 5, it may be recognized that a relaxation time of a magnetic tunnel junction device is lowest in the free magnetic layer (the experimental example) of the synthetic antiferromagnetic structure including the free layers having the perpendicular magnetizations. In addition, it may be recognized that the relaxation time of the magnetic tunnel junction device is 100 ns or less when the free magnetic layer according to the experimental example has a thermal stability smaller than 10.

Figure 6:
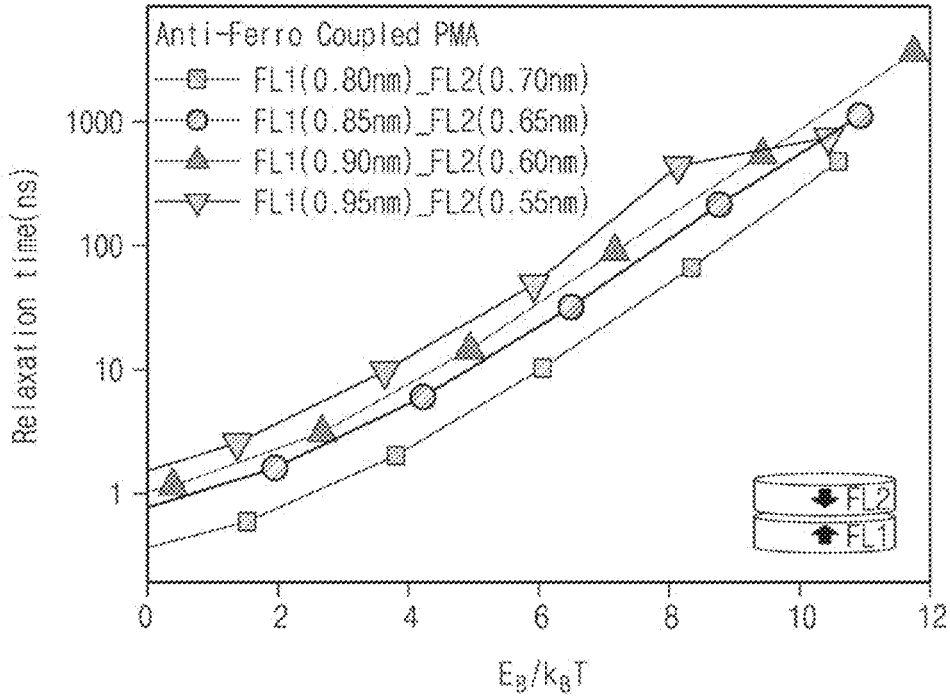
FIG. 6 is a graph showing a relaxation time of a magnetic tunnel junction device according to a net magnetization of a free magnetic layer.

FIG. 6 is a graph showing a relaxation time of a magnetic tunnel junction device according to a net magnetization of a free magnetic layer.

Referring to FIG. 6, when the free layers FL1 and FL2 (e.g., the first and second free layers 131 and 133 of FIG. 1) constituting the free magnetic layer according to the experimental example of FIG. 5 have saturation magnetizations Ms of the same magnitude, a net magnetization of the free magnetic layer may be changed by changing a ratio of thicknesses of the free layers FL1 and FL2. In this case, as the ratio of the thicknesses of the free layers FL1 and FL2 decreases, the net magnetization of the free magnetic layer may decrease. According to FIG. 6, it may be recognized that the relaxation time of the magnetic tunnel junction device decreases as the net magnetization of the free magnetic layer decreases.

Figure 7:
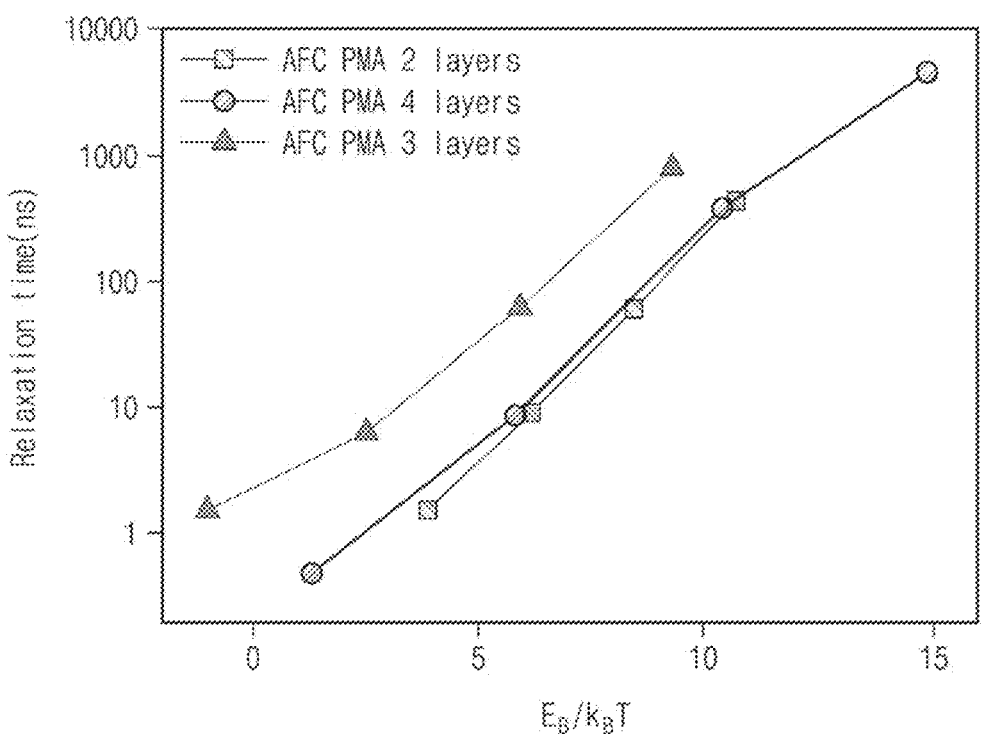
FIG. 7 is a graph showing a relaxation time of a magnetic tunnel junction device according to a net magnetization of a free magnetic layer.

FIG. 7 is a graph showing a relaxation time of a magnetic tunnel junction device according to a net magnetization of a free magnetic layer.

Referring to FIG. 7, when the free layers constituting the free magnetic layer according to the experimental example of FIG. 5 have the saturation magnetizations Ms of the same magnitude and the same thickness T, the net magnetization of the free magnetic layer may be changed by changing the number of the free layers. In this case, when the number of the free layers in the free magnetic layer is an even number, the net magnetization of the free magnetic layer may decrease. According to FIG. 7, it may be recognized that the relaxation time of the magnetic tunnel junction device decreases as the net magnetization of the free magnetic layer decreases.

Figure 8:
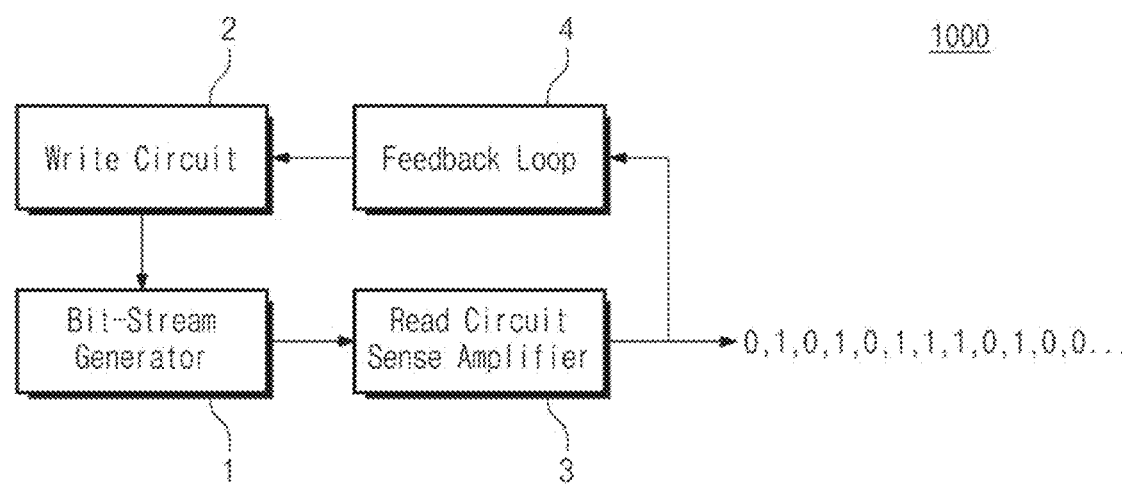
FIG. 8 is a block diagram illustrating a stochastic computing system according to some embodiments of inventive concepts.

FIG. 8 is a block diagram illustrating a stochastic computing system according to some embodiments of inventive concepts.

Referring to FIG. 8, a stochastic computing system 1000 may include a random bit-stream generator 1, a write circuit 2 configured to provide a current for generating a bit in the random bit-stream generator 1, a read circuit structure 3 including a read circuit configured to read a bit generated by the random bit-stream generator 1 and a sense amplifier for amplifying the generated bit, and a feedback loop 4 for transmitting bit data read by the read circuit structure 3 back to the write circuit 2. The random bit-stream generator 1 may include at least one of the magnetic tunnel junction devices 500, 510, 520 and 530 according to the embodiments of inventive concepts, described with reference to FIGS. 1 to 4. In other words, the magnetic tunnel junction device 500/510/520/530 according to the embodiments of inventive concepts may be used as the random bit-stream generator 1 of the stochastic computing system 1000.

According to embodiments of inventive concepts, the free magnetic layer 130 of the magnetic tunnel junction device 500/510/520/530 may have the synthetic antiferromagnetic (SAF) structure in which the plurality of free layers having the perpendicular magnetizations are antiferromagnetically coupled to each other. The energy barrier $E_B$ of each of the plurality of free layers or the energy barrier $E_B$ of the free magnetic layer 130 may be adjusted in such a way that the thermal stability $\Delta$ of the free magnetic layer 130 is 15 or less (e.g., in a range of 0 to 15). In addition, the saturation magnetization Ms and the thickness T of each of the plurality of free layers may be adjusted in such a way that the net magnetization Mst of the free magnetic layer 130 is 0. Thus, the relaxation time of the magnetic tunnel junction device 500/510/520/530 may be reduced, and as a result, the operating speed of the stochastic computing system including the magnetic tunnel junction device 500/510/520/530 may be increased.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments of inventive concepts have been particularly shown and described, it will be understood by one of ordinary skill in the art that variations in form and detail may be made therein without departing from the spirit and scope of the attached claims

What is claimed is:

1. A magnetic tunnel junction device comprising:
a pinned magnetic layer, a free magnetic layer, and a tunnel barrier layer between the pinned magnetic layer and the free magnetic layer,
the free magnetic layer including a first free layer, a second free layer spaced apart from the tunnel barrier layer, the first free layer interposed between the tunnel barrier layer and the second free layer, and a spacer layer between the first free layer and the second free layer, wherein a thermal stability of the first free layer is in a range of 0 to 15, and a thermal stability the second free layer is in a range of 0 to 15,
the first free layer and the second free layer being antiferromagnetically coupled to each other by the spacer layer,
a magnetization direction of the first free layer and a magnetization direction of the second free layer each being perpendicular to an interface between the free magnetic layer and the tunnel barrier layer, and
a thermal stability of the free magnetic layer being in a range of 0 to 15.

2. The magnetic tunnel junction device of claim 1, wherein the free magnetic layer is configured to allow a net magnetization of the free magnetic layer to be 0.

3. The magnetic tunnel junction device of claim 2, wherein a thickness of the first free layer and a thickness of the second free layer are each in a direction perpendicular to the interface between the free magnetic layer and the tunnel barrier layer, and
wherein the net magnetization of the free magnetic layer satisfies formula 5, $$Mst=Ms1T1+Ms2T2=0, \qquad \text{[Formula 5]}$$

wherein, in Formula 5,
Mst is a net magnetization of the free magnetic layer,
Ms1 and T1 are a saturation magnetization of the first free layer and the thickness of the first free layer, respectively, and
Ms2 and T2 are a saturation magnetization of the second free layer and the thickness of the second free layer, respectively.

4. The magnetic tunnel junction device of claim 1, wherein the pinned magnetic layer comprises a first pinned layer, a second pinned layer between the first pinned layer and the tunnel barrier layer, and an exchange coupling layer between the first pinned layer and the second pinned layer,
wherein the first pinned layer and the second pinned layer are antiferromagnetically coupled to each other by the exchange coupling layer, and
wherein a magnetization direction of the first pinned layer and a magnetization direction of the second pinned layer each are perpendicular to the interface between the free magnetic layer and the tunnel barrier layer.

5. The magnetic tunnel junction device of claim 4, wherein a thermal stability of the pinned magnetic layer is 40 or more.

6. The magnetic tunnel junction device of claim 5, wherein a thermal stability of the first pinned layer and a thermal stability of the second pinned layer is 40 or more.

7. The magnetic tunnel junction device of claim 1, further comprising:
a lower electrode; and
an upper electrode on the lower electrode,
wherein the pinned magnetic layer, the free magnetic layer, and the tunnel barrier layer are between the lower electrode and the upper electrode, and
wherein the free magnetic layer is between the tunnel barrier layer and the upper electrode.

8. The magnetic tunnel junction device of claim 1, further comprising,
a lower electrode; and
an upper electrode on the lower electrode,
wherein the pinned magnetic layer, the free magnetic layer and the tunnel barrier layer are between the lower electrode and the upper electrode, and
wherein the free magnetic layer is between the tunnel barrier layer and the lower electrode.

9. The magnetic tunnel junction device of claim 1, wherein
the first free layer and the second free layer each include at least one of iron (Fe), cobalt (Co), or nickel (Ni), and
wherein the spacer layer includes a non-magnetic metal.

10. The magnetic tunnel junction device of claim 9, wherein the spacer layer includes ruthenium (Ru), iridium (Ir), tungsten (W), tantalum (Ta), or any alloy thereof.

11. A magnetic tunnel junction device comprising:

a pinned magnetic layer, a free magnetic layer, and a tunnel barrier layer between the pinned magnetic layer and the free magnetic layer, the free magnetic layer including a plurality of free layers stacked on the tunnel barrier layer and a plurality of spacer layers between the plurality of free layers, respectively, the plurality of free layers being antiferromagnetically coupled to each other by the plurality of spacer layers, wherein the plurality of free layers include a first free layer and a second free layer, a thermal stability of the first free layer is in a range of 0 to 15, and a thermal stability the second free layer is in a range of 0 to 15, each of the plurality of free layers having a magnetization direction perpendicular to an interface between the free magnetic layer and the tunnel barrier layer, and the free magnetic layer being configured to allow a net magnetization of the free magnetic layer to be 0.

12. The magnetic tunnel junction device of claim 11, wherein each of the plurality of free layers has a thickness in a direction perpendicular to the interface between the free magnetic layer and the tunnel barrier layer, and wherein the net magnetization of the free magnetic layer satisfies formula 4, $$Mst = \sum_{i=1}^{n} MsiTi = 0 \qquad \text{[Formula 4]}$$

wherein, in Formula 4,

Mst is the net magnetization of the free magnetic layer,

Msi is a saturation magnetization of each of the plurality of free layers,

Ti is the thickness of each of the plurality of free layers, and n is a number of the plurality of free layers.

13. The magnetic tunnel junction device of claim 11, wherein a thermal stability of the free magnetic layer is in a range of 0 to 15.

14. The magnetic tunnel junction device of claim 11, wherein the pinned magnetic layer comprises a first pinned layer, a second pinned layer between the first pinned layer and the tunnel barrier layer, and an exchange coupling layer between the first pinned layer and the second pinned layer, wherein the first pinned layer and the second pinned layer are antiferromagnetically coupled to each other by the exchange coupling layer, and wherein a magnetization direction of the first pinned layer and a magnetization direction of the second pinned layer each are direction perpendicular to the interface between the free magnetic layer and the tunnel barrier layer.

15. A stochastic computing system comprising:

a random bit-stream generator comprising a magnetic tunnel junction device, the magnetic tunnel junction device including a pinned magnetic layer, a free magnetic layer, and a tunnel barrier layer between the pinned magnetic layer and the free magnetic layer, the free magnetic layer including a first free layer, a second free layer spaced apart from the tunnel barrier layer with the first free layer therebetween, and a spacer layer between the first free layer and the second free layer, wherein a thermal stability of the first free layer is in a range of 0 to 15, and a thermal stability the second free layer is in a range of 0 to 15, the first free layer and the second free layer being antiferromagnetically coupled to each other by the spacer layer, a magnetization direction of the first free layer and a magnetization direction of the second free layer each being perpendicular to an interface between the free magnetic layer and the tunnel barrier layer, and the free magnetic layer being configured to allow a net magnetization of the free magnetic layer to be 0;

a write circuit configured to provide a current for generating a bit in the random bit-stream generator; and a read circuit configured to read the bit generated by the random bit-stream generator.

16. The stochastic computing system of claim 15, wherein the spacer layer is a first spacer layer, wherein the free magnetic layer further comprises a third free layer and a second spacer layer, the third free layer is spaced apart from the tunnel barrier layer, the first free layer, the first spacer layer, and the second free layer are between the tunnel barrier layer and the third free layer, and the second spacer layer is between the second free layer and the third free layer, wherein the second free layer and the third free layer are antiferromagnetically coupled to each other by the second spacer layer, and wherein a magnetization direction of the third free layer is perpendicular to the interface between the free magnetic layer and the tunnel barrier layer.

17. The stochastic computing system of claim 15, wherein a thermal stability of the free magnetic layer is in a range of 0 to 15.

*   *   *   *   *